(12) United States Patent
Ying et al.

(10) Patent No.: US 10,886,912 B2
(45) Date of Patent: Jan. 5, 2021

(54) GATE CIRCUIT AND GATE DRIVE CIRCUIT FOR POWER SEMICONDUCTOR SWITCH

(71) Applicant: Delta Electronics, Inc., Taoyuan (CN)

(72) Inventors: Jianping Ying, Taoyuan (CN); Ming Wang, Taoyuan (CN); Xiaobo Huang, Taoyuan (CN); Jun Liu, Taoyuan (CN)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/391,436

(22) Filed: Apr. 23, 2019

(65) Prior Publication Data

US 2020/0036379 A1 Jan. 30, 2020

(30) Foreign Application Priority Data

Jul. 26, 2018 (CN) .......................... 2018 1 0836997

(51) Int. Cl.
*H03K 3/00* (2006.01)
*H03K 17/16* (2006.01)

(52) U.S. Cl.
CPC ......... *H03K 17/168* (2013.01); *H03K 17/162* (2013.01)

(58) Field of Classification Search
CPC .. H03K 17/168; H03K 17/162; H03K 17/163; H03K 17/08128; H03K 2017/066; H03K 17/063; H03K 17/691; H03K 2217/0081; H03K 17/61; H03K 17/081
USPC ....................................................... 327/109
See application file for complete search history.

(56) References Cited

U.S. PATENT DOCUMENTS

| | | | |
|---|---|---|---|
| 5,818,281 A * | 10/1998 | Ohura | H02M 7/538 327/381 |
| 8,395,422 B2 * | 3/2013 | Ogawa | H03K 17/04123 327/109 |
| 9,941,874 B2 * | 4/2018 | Hasegawa | H03K 17/102 |
| 2012/0262220 A1 * | 10/2012 | Springett | H03K 17/567 327/430 |
| 2014/0320194 A1 * | 10/2014 | Rozman | H03K 17/167 327/382 |
| 2016/0072382 A1 * | 3/2016 | Ranmuthu | H02M 1/32 363/60 |
| 2016/0285353 A1 * | 9/2016 | Kim | H02M 1/4208 |
| 2017/0063072 A1 * | 3/2017 | Miller | H02M 1/36 |

(Continued)

FOREIGN PATENT DOCUMENTS

| CN | 203840190 U | 9/2014 |
|---|---|---|
| CN | 104158385 B | 8/2016 |

*Primary Examiner* — Ryan Jager
(74) *Attorney, Agent, or Firm* — Yunling Ren (57) ABSTRACT

The present disclosure provides a gate circuit and a gate drive circuit for a power semiconductor switch, including: a zener diode and a charge dissipation circuit. A first end of the zener diode is connected to a first end of the charge dissipation circuit and a gate of the power semiconductor switch, a second end of the zener diode is connected to a second end of the charge dissipation circuit and a second end of the power semiconductor switch. A first parasitic capacitor is formed between a first end and the gate of the power semiconductor switch, and a second parasitic capacitor is formed between the gate and the second end of the power semiconductor switch.

20 Claims, 6 Drawing Sheets

(56) References Cited

U.S. PATENT DOCUMENTS

2017/0153295 A1* 6/2017 Huang .................. G01R 31/40
2019/0286181 A1* 9/2019 Iwamizu ................ G05F 1/573

* cited by examiner

GATE CIRCUIT AND GATE DRIVE CIRCUIT FOR POWER SEMICONDUCTOR SWITCH

CROSS REFERENCE

This application is based upon and claims priority to Chinese Patent Application No. 201810836997.2, filed on Jul. 26, 2018, the entire contents thereof are incorporated herein by reference.

TECHNICAL FIELD

The present disclosure relates to electrical components, and more particularly to a gate circuit and a gate drive circuit for a power semiconductor switch.

BACKGROUND

Figure 1:
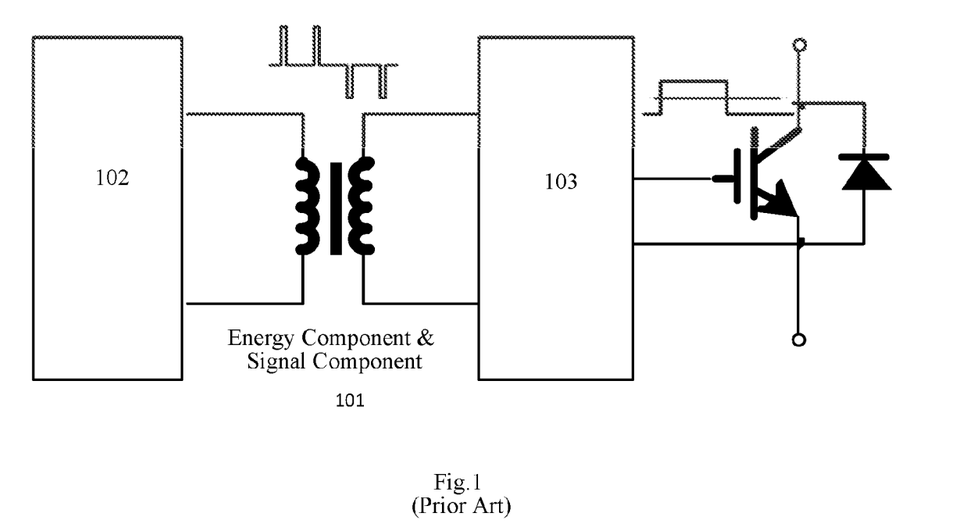
FIG. 1 is a schematic diagram of a gate drive circuit for a power semiconductor switch in the related art.

In recent years, power devices such as IGBT (Insulated Gate Bipolar Transistor) and MOSFET (Metal-Oxide-Semiconductor Field-Effect Transistor) have been ever more extensively used in power conversion applications. Different applications require different voltage and current levels and different combinations of power devices, so the drive circuit of power devices is also particularly important. The existing optical isolation driver and magnetic isolation driver require a stable voltage source and corresponding logic processing circuit. Therefore, the foregoing driver which involves many components is complicated, and the cost of it is high. On the contrary, the simple drive circuit is simple, and the cost of it is low. The operation principle of the simple drive circuit is shown in FIG. 1. A control board 102 modulates a control signal into a positive and negative narrow pulse signal, including an energy component and a signal component, and supplies the positive and negative narrow pulse signals to the simple drive circuit 103 through a transformer 101. That is, in FIG. 1, the gate capacitor of the power device is directly charged and discharged through the positive and negative narrow pulses, thereby realizing the function of driving the power device to be turned on or off.

However, the simple drive circuit also has some shortcomings. In practical applications, since there is no stable power supply, when the driving signal is lost, if there is a relatively higher voltage jump at both ends of the power device, the voltage jump may affect the gate voltage of the power device through the Miller capacitor of the power device, causing the power device to be conducted by mistake, and thus resulting in damage to the power device.

Therefore, improving the anti-interference ability of the gate of the power device is an important factor for reliable driving and reliable application.

SUMMARY

It is an object of the present disclosure to provide a gate circuit and a gate drive circuit for a power semiconductor switch to overcome the above-described technical problems at least to some extent due to limitations and disadvantages of the related art.

Other features and advantages of the present disclosure will be apparent from the description and appended claims, or partly learned from practice of the present disclosure.

According to a first aspect of the present disclosure, there is provided a gate circuit for a power semiconductor switch, including: a zener diode and a charge dissipation circuit, wherein a first end of the zener diode is connected to a first end of the charge dissipation circuit and a gate of the power semiconductor switch, a second end of the zener diode is connected to a second end of the charge dissipation circuit and a second end of the power semiconductor switch.

A first parasitic capacitor is formed between a first end and the gate of the power semiconductor switch, and a second parasitic capacitor is formed between the gate and the second end of the power semiconductor switch; when a voltage jump occurs between the first end and the second end of the power semiconductor switch, a current output from the first end is injected into the first parasitic capacitor and the second parasitic capacitor; when the current is greater than or equal to a preset value, the charge dissipation circuit will work, such that charges on the first parasitic capacitor and the second parasitic capacitor are discharged through the charge dissipation circuit.

Optionally, the charge dissipation circuit includes a first switch and a second resistor.

The first switch and the second resistor are connected in series to form a series branch, a first end of the series branch is connected to the first end of the charge dissipation circuit, and a second end of the series branch is connected to the second end of the charge dissipation circuit.

Optionally, when the current is greater than or equal to the preset value, the first switch is turned on, such that the charge dissipation circuit will work.

Optionally, when the current is less than the preset value, the first switch is turned off, such that the charge dissipation circuit will stop working.

Optionally, the charge dissipation circuit includes a first diode, a second resistor, a transistor, a third resistor, a fourth resistor, a second diode and a capacitor, an anode of the first diode is connected to a first end of the third resistor, a first end of the capacitor, a first end of the fourth resistor and a base of the transistor, a cathode of the first diode, a second end of the third resistor and an emitter of the transistor are connected to the first end of the charge dissipation circuit, a collector of the transistor is connected to an anode of the second diode, a cathode of the second diode is connected to a first end of the second resistor, and a second end of the capacitor, a second end of the fourth resistor and a second end of the second resistor are connected to the second end of the charge dissipation circuit.

Optionally, the transistor is a PNP type transistor.

Optionally, when the current is greater than or equal to the preset value, the transistor is turned on, such that the charge dissipation circuit will work.

Optionally, when the current is less than the preset value, the transistor is turned off, such that the charge dissipation circuit will stop working.

Optionally, the charge dissipation circuit includes a second switch and a fifth resistor, a first end of the second switch and a second end of the fifth resistor are connected to the first end of the charge dissipation circuit; a second end of the second switch is connected to the second end of the charge dissipation circuit; and a control end of the switch is connected to a first end of the fifth resistor.

Optionally, the second switch is a thyristor.

Optionally, when the current is greater than or equal to the preset value, the second switch is turned on, such that the charge dissipation circuit will work.

Optionally, when the current is less than the preset value, the second switch is turned off, such that the charge dissipation circuit will stop working.

Optionally, the gate circuit for a power semiconductor switch further includes a first resistor, wherein a first end of the first resistor is connected to the first of the zener diode and the gate of the power semiconductor switch, and a second end of the first resistor is connected to the second end of the zener diode and the second end of the power semiconductor switch.

According to another aspect of the present disclosure, there is provided a gate drive circuit for a power semiconductor switch, including: a drive pulse modulation circuit, a pulse transformer, a drive pulse demodulation circuit, and a gate circuit for a power semiconductor switch as described above, wherein an output end of the drive pulse modulation circuit is connected to a primary winding of the pulse transformer, a secondary winding of the pulse transformer is connected to an input end of the drive pulse demodulation circuit, and an output end of the e drive pulse demodulation circuit is connected to the gate circuit; the drive pulse modulation circuit is configured to receive a control signal and modulate the control signal into at least one positive and negative narrow pulse signal to be transmitted to the drive pulse demodulation circuit through the pulse transformer, for charging or discharging the second parasitic capacitor through the drive pulse demodulation circuit to drive the power semiconductor switch to be turned on or off.

Optionally, the drive pulse demodulation circuit includes a first controlled switch, a second controlled switch, a control terminal circuit, and a second zener diode, a first end of the first controlled switch is connected to a first end of the secondary winding and a first end of the control terminal circuit, a first end of the second controlled switch is connected to a second end of the secondary winding and a second end of the control terminal circuit, a third end of the control terminal circuit is connected to a control end of the first controlled switch, a fourth end of the control terminal circuit is connected to a second controlled switch, a second end of the first controlled switch is coupled to a first end of the second zener diode, and a second end of the second controlled switch is coupled to a second end of the second zener diode.

Optionally, the first end of the second zener diode is connected to a first input end of the charge dissipation circuit, and the second end of the second zener diode is connected to a second input of the charge dissipation circuit.

Optionally, the gate circuit further includes a first resistor, a first end of the first resistor is connected to the first end of the zener diode and the gate of the power semiconductor switch, a second end of the first resistor is connected to the second end of the zener diode and the second end of the power semiconductor switch.

Optionally, the positive and negative narrow pulse signals include a driving pulse signal and an energy pulse signal.

Optionally, for driving the power semiconductor switch to be turned on, the drive pulse modulation circuit is configured to output one positive narrow pulse signal at first predetermined intervals, such that a voltage across the second parasitic capacitor is greater than or equal to a threshold of the power semiconductor switch, in order to drive the power semiconductor switch to be turned on.

Optionally, for driving the power semiconductor switch to be turned off, the drive pulse modulation circuit is configured to output at least one negative narrow pulse signal such that the voltage across the second parasitic capacitor is less than a threshold of the power semiconductor switch, in order to drive the power semiconductor switch to be turned off.

The gate circuit and the gate drive circuit of the power semiconductor switch provided by the present disclosure have the following advantages compared to the related art. On the one hand, the gate drive circuit of the power semiconductor switch provided by the present disclosure only includes the resistor, the zener diode and the self-control switch, thus having a simple structure. On the other hand, it can also retain the advantages of a small number of devices and a low cost as the simple drive circuit has. Moreover, it can improve the gate anti-interference ability of the simple drive circuit, thus improving the circuit reliability.

For a better understanding of the features and technical aspects of the present disclosure, reference should be made to the detailed description and the accompanying drawings. However, the detailed description and the accompanying drawings are merely illustrative of the present disclosure and are not intended to limit the scope of the claims of the present disclosure.

BRIEF DESCRIPTION OF THE DRAWINGS

The above and other features and advantages of the present disclosure will become more apparent from the detailed description of the exemplary embodiments.

REFERENCE NUMERALS 101 transformer
102 control panel
103 simple drive circuit
330, 430, 530 power semiconductor switch
340, 440, 540 zener diode
310, 410, 510 charge dissipation circuit
610, 710 gate circuit
Cp1 first parasitic capacitor
Cp2 second parasitic capacitor
R1 first resistor
R2 second resistor
R3 third resistor
R4 fourth resistor
R5 fifth resistor
R11-R13, R21-23, R31 resistor
S1 first switch
S2 second switch
T1 transistor
C1 capacitor
D1 first diode
D2 second diode
610 control circuit
621 first controlled switch
622 second controlled switch
631 primary winding
632 secondary winding
641 second zener diode
W1, W, W2 zener diode M1, M2 semiconductor field effect transistor
D3, D4 diode
T2 pulse transformer

DETAILED DESCRIPTION

Exemplary embodiments will now be described more fully with reference to the accompanying drawings. However, the exemplary embodiments can be embodied in a variety of forms and should not be construed as being limited to the embodiments set forth herein. Rather, these embodiments are provided such that the present disclosure will be thorough and complete, and to fully convey the concept of the exemplary embodiments to those skilled in the art. The same reference numerals in the drawings denote the same or similar parts, and the repeated description thereof will be omitted.

Furthermore, the described features, structures, or characteristics may be combined in any suitable manner in one or more embodiments. In the following description, numerous specific details are set forth to facilitate thorough understanding of the embodiments of the present disclosure. However, one skilled in the art will appreciate that the present disclosure may be practiced without one or more of the specific details, or other structures, components, steps, methods, etc. may be employed. In other instances, well known structures, components or operations are not shown or described in detail to avoid obscuring aspects of the present disclosure.

Figure 2:
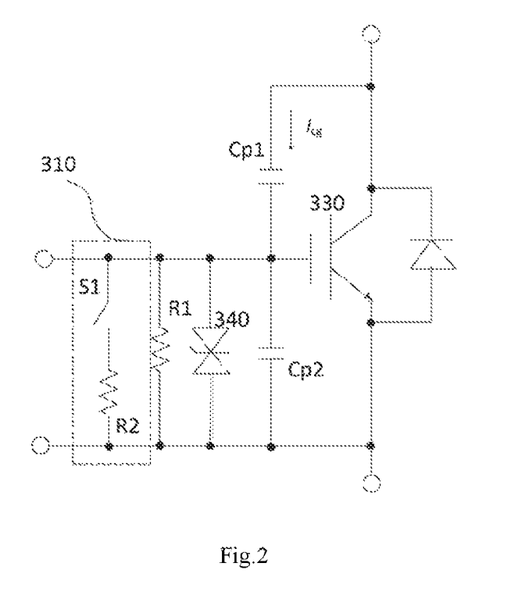
FIG. 2 is a schematic diagram of a gate circuit for a power semiconductor switch according to a first embodiment of the present disclosure.

Firstly, reference is made to FIG. 2. FIG. 2 is a schematic diagram of a gate circuit for a power semiconductor switch according to a first embodiment of the present disclosure. The gate circuit for the power semiconductor switch 330 includes a zener diode 340 and a charge dissipation circuit 310.

A first end of the zener diode 340 is connected to a first end of the charge dissipation circuit 310 and a gate of the power semiconductor switch 330, and a second end of the zener diode 340 is connected to a second end of the charge dissipation circuit 310 and a second end of the power semiconductor switch 330.

For example, a first parasitic capacitor Cp1 is formed between the first end and the gate of the power semiconductor switch 330, and a second parasitic capacitor Cp2 is formed between the gate and the second end of the power semiconductor switch 330. When a voltage jump occurs between the first end and the second end of the power semiconductor switch 330, the current $i_{cg}$ outputted from the first end is injected into the first parasitic capacitor Cp1 and the second a parasitic capacitor Cp2. When the current $i_{cg}$ outputted from the first end is greater than or equal to a preset value, the charge dissipation circuit 340 will work, such that charges on the first parasitic capacitor Cp1 and the second parasitic capacitor Cp2 are discharged through the charge dissipation circuit 310.

Various embodiments of the present disclosure can be applied to a simple drive circuit of a power semiconductor switch, which does not have a stable power supply, and simultaneously transmits signals and energy through pulses. When a simple drive circuit of a power semiconductor switch loses driving signal, if a higher voltage jump appears at both ends of the power switch, a current $i_{cg}$ charges the second parasitic capacitor Cp2 through the Miller capacitor (the first parasitic capacitor Cp1). When the current $i_{cg}$ flowing into the Miller capacitor reaches a preset value, the charge dissipation circuit 310 may be work at this time, such that the charges flowing in through the Miller capacitor can be discharged through the charge dissipation circuit 310. Thereby, the gate voltage will not be pulled up, and it can ensure that the power semiconductor switch will not be damaged.

For example, the power semiconductor switch 330 may be an IGBT, and the first end of the power semiconductor switch 330 is the collector of the IGBT, and the second end of the power semiconductor switch 330 is the emitter of the IGBT. The power semiconductor switch 330 may also be a MOSFET. The first end of the power semiconductor switch 330 is the drain of the MOSFET and the second end of the power semiconductor switch 330 is the source of the MOSFET. However, the present disclosure is not limited thereto.

In the embodiment, the gate circuit for the power semiconductor switch further includes a first resistor R1. A first end of the first resistor R1 is connected to the first end of the zener diode 340 and the gate of the power semiconductor switch 330, and a second end of the first resistor R1 is connected to the second end of the zener diode 340 and the second end of the power semiconductor switch 330.

In the embodiment, the charge dissipation circuit 310 includes a first switch S1 and a second resistor R2. The first switch S1 and the second resistor R2 are connected in series to form a series branch. A first end of the series branch is connected to the first end of the charge dissipation circuit 310, and a second end of the series branch is connected to a second end of the charge dissipation circuit 310. For example, a first end of the first switch S1 is connected to the first end of the charge dissipation circuit 310. That is, the first end of the first switch S1 is connected to the first end of the zener diode 340 and the gate of the power semiconductor switch 330; a second end of the first switch S1 is connected in series with a first end of the second resistor R2. A second end of the second resistor R2 is connected to the second end of the charge dissipation circuit 310. That is, the second end of the second resistor R2 is connected to the second end of the zener diode 340 and the second end of the power semiconductor switch 330. In other embodiments, the first end of the second resistor R2 is connected to the first end of the zener diode 340, the second end of the second switch R2 is connected to the first end of the first switch S1, and the second end of the first switch S1 is connected to the second end of the zener diode 340.

In the embodiment, when the current $i_{cg}$ outputted from the first end of the power semiconductor switch 330 is greater than or equal to the preset value, the first switch S1 is turned on, such that the charge dissipation circuit 310 will work. Then, charges on the first parasitic capacitor Cp1 and the second parasitic capacitor Cp2 are discharged through the charge dissipation circuit 310. That is, the charges on the first parasitic capacitor Cp1 and the second parasitic capacitor Cp2 are discharged through the first switch S1 and the resistor R2, such that the gate voltage will not be pulled up and it can ensure that the power semiconductor switch will not be damaged. Correspondingly, in the embodiment, when the current $i_{cg}$ of the power semiconductor switch 330 is less than the preset value, the first switch S1 is turned off, such that the charge dissipation circuit 310 will stop working to prevent charges on the first parasitic capacitor Cp1 and the second parasitic capacitor Cp2 from being discharged.

Figure 3:
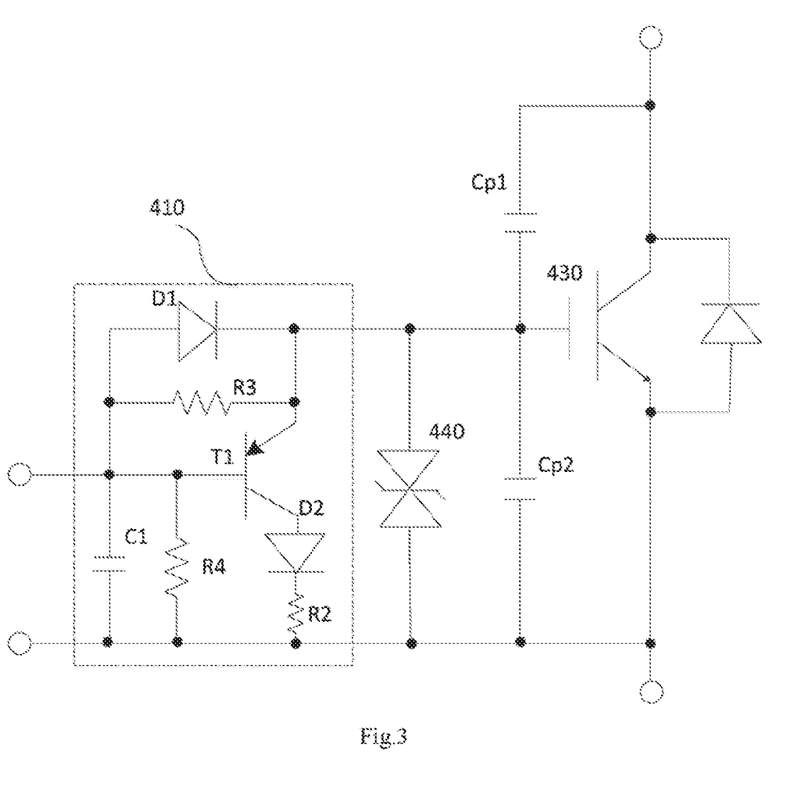
FIG. 3 is a schematic diagram of a gate circuit for a power semiconductor switch according to a second embodiment of the present disclosure.

Referring to FIG. 3, FIG. 3 is a schematic diagram of a gate circuit for a power semiconductor switch according to a second embodiment of the present disclosure. The embodiment shown in FIG. 3 is similar to FIG. 2. The gate circuit of power semiconductor switch 430 includes a zener diode 440 and a charge dissipation circuit 410.

The first end of the zener diode 440 is connected to the first end of the charge dissipation circuit 410 and the gate of the power semiconductor switch 430, and the second end of the zener diode 440 is connected to the second end of the charge dissipation circuit 410 and the second end of the power semiconductor switch 430.

Different from the embodiment shown in FIG. 2, in this embodiment, the charge dissipation circuit 410 includes a first diode D1, a second resistor R2, a transistor T1, a third resistor R3, and a fourth resistor R4, a second diode D2 and a capacitor C1. An anode of the first diode D1 is connected to a first end of the third resistor R3, a first end of the capacitor C1, a first end of the fourth resistor R4, and a base of the transistor T1. A cathode of the first diode D1, a second end of the third resistor R3, and an emitter of the transistor T1 are connected to the first end of the charge dissipation circuit 410. That is, the cathode of the first diode the second end of the third resistor R3, and the emitter of the transistor T1, the gate of the power semiconductor switch 430, and the first end of the zener diode 440 are connected together. A collector of the transistor T1 is connected to the anode of the second diode D2, and a cathode of the second diode D2 is connected to a first end of the second resistor R2. A second end of the capacitor C1, a second end of the fourth resistor R4, and a second end of the second resistor R2 are connected to the second end of the charge dissipation circuit 410. That is, the second end of the capacitor C1, the second end of the fourth resistor R4, the second end of the second resistor R2 and the second end of the zener diode 440 are connected together. For example, the transistor may be a PNP type transistor.

Further, when the current $i_{cg}$ outputted from the first end of the power semiconductor switch 430 is greater than or equal to the preset value, the transistor T1 is turned on, such that the charge dissipation circuit 410 will work, and charges on the parasitic capacitor Cp2 is discharged through the charge dissipation circuit 410. That is, the charges on the second parasitic capacitor Cp2 is discharged through the transistor T1, the diode D2, and the resistor R2, thereby achieving a function of gate anti-interference. Moreover, the gate voltage will not be pulled up, and it can ensure that the power switch will not be damaged. When the current $i_{cg}$ outputted from the first end of the power semiconductor switch 430 is less than the preset value, the transistor T1 is turned off, such that the charge dissipation circuit 410 will stop working to prevent the first parasitic capacitor Cp1 and the second parasitic capacitor Cp2 from being discharged.

Figure 4:
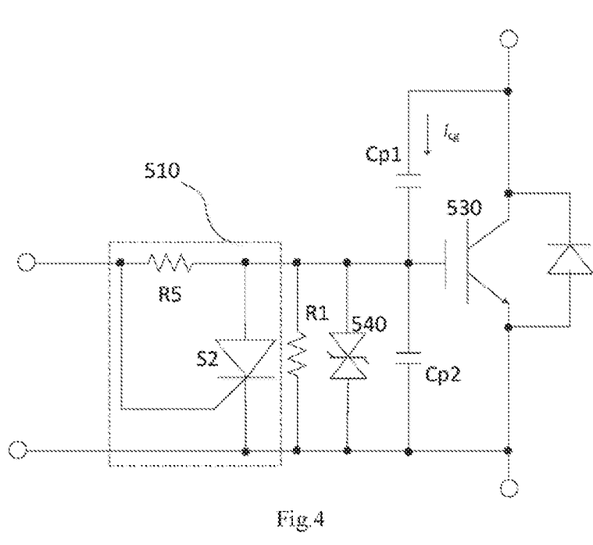
FIG. 4 is a schematic diagram of a gate circuit for a power semiconductor switch according to a third embodiment of the present disclosure.

Referring to FIG. 4, FIG. 4 is a schematic diagram of a gate circuit for a power semiconductor switch according to a third embodiment of the present disclosure.

The embodiment shown in FIG. 4 is similar to FIG. 2. The gate circuit for the power semiconductor switch 530 includes a zener diode 540, a first resistor R1, and a charge dissipation circuit 510.

The first end of the zener diode 540 is connected to the first end of the charge dissipation circuit 510 and the gate of the power semiconductor switch 530, and the second end of the zener diode 540 is connected to the second end of the discharge circuit 510 and the second end of the power semiconductor switch 530.

Different from the embodiment shown in FIG. 2, in the embodiment, the charge dissipation circuit 510 includes a second switch S2 and a fifth resistor R5. A first end of the second switch S2 and a second end of the fifth resistor R5 are connected to the first end of the charge dissipation circuit 510. That is, the first end of the second switch S2 and the second end of the fifth resistor R5 are connected to the first end of the zener diode 540 and the gate of the power semiconductor switch 530. A second end of the second switch S2 is connected to the second end of the charge dissipation circuit 510. That is, the second end of the second switch S2 is connected to the second end of the zener diode 540 and the second end of the power semiconductor switch 530. The control end of the second switch S2 is connected to a first end of the fifth resistor R5. In this embodiment, the second switch S2 may be a thyristor.

For example, when the current $i_{cg}$ outputted from the first end of the power semiconductor switch 530 is greater than or equal to the preset value, the second switch S2 is turned on, such that the charge dissipation circuit 510 will work, and charges on the first parasitic capacitor Cp1 and the second parasitic capacitor Cp2 are discharged through the charge dissipation circuit 510, thereby realizing the function of the gate anti-interference. Moreover, the gate voltage may not be pulled up, and it can ensure that the power semiconductor switch will not be damaged. When the current $i_{cg}$ outputted from the first end of the power semiconductor switch 530 is less than the preset value, the second switch S2 is turned off, such that the charge dissipation circuit 510 will stop working to prevent charges on the first parasitic capacitor Cp1 and the second parasitic capacitor Cp2 from being discharged.

Figure 5:
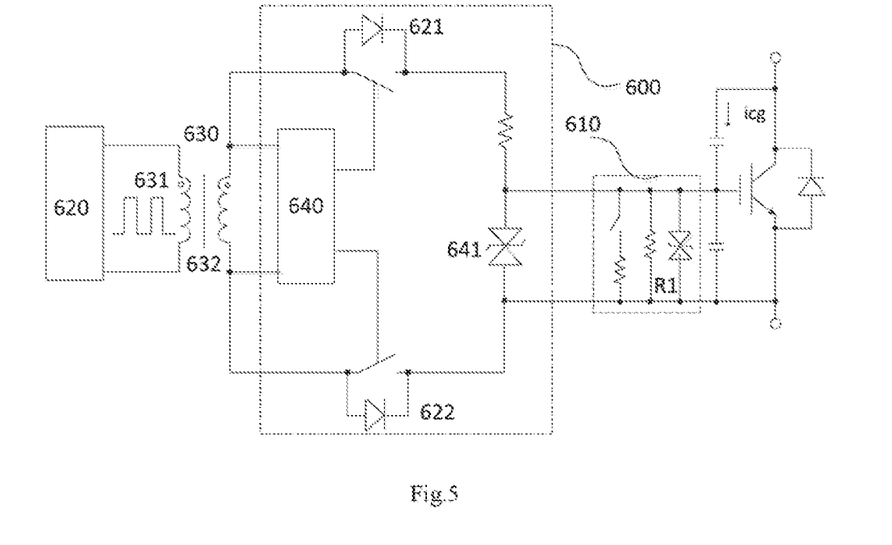
FIG. 5 is a schematic diagram of a gate drive circuit for a power semiconductor switch according to a fourth embodiment of the present disclosure.

Referring to FIG. 5, FIG. 5 is a schematic diagram of a gate drive circuit for a power semiconductor switch according to a fourth embodiment of the present disclosure. The gate drive circuit of the power semiconductor switch includes a drive pulse modulation circuit 620, a pulse transformer 630, a drive pulse demodulation circuit 600, and a gate circuit 610 of the power semiconductor switch of any of the above embodiments. An output end of the drive pulse modulation circuit is connected to a primary winding 631 of the pulse transformer 630, a secondary winding 632 of the pulse transformer 630 is connected to an input end of the drive pulse demodulation circuit 600, and an output end of the drive pulse demodulation circuit 600 is connected to the gate circuit 610. The drive pulse modulation circuit 620 receives a control signal and modulates the control signal into at least one positive and negative narrow pulse signal. The at least one positive and negative narrow pulse signal is transmitted to the drive pulse demodulation circuit 600 through the pulse transformer 630, and the second parasitic capacitor Cp2 of the gate of the power semiconductor switch is charged or discharged by the at least one positive and negative narrow pulse signal through the drive pulse demodulation circuit 600, to drive the power semiconductor switch to be turned on or off. For example, the positive and negative pulse signals include a drive pulse signal and an energy pulse signal. For driving the power semiconductor switch (denoted by the reference numeral 330 in FIG. 2) to be turned on, the drive pulse modulation circuit outputs one positive narrow pulse signal at an first predetermined intervals, such that voltage across the second parasitic capacitor (denoted by the reference numeral Cp2 in FIG. 2) is greater than or equal to the threshold value of the power semiconductor switch (denoted by the reference numeral 330 in FIG. 2). For driving the power semiconductor switch (denoted by the reference numeral 330 in FIG. 2) to be turned off, the drive pulse modulation circuit outputs one negative narrow pulse signal such that the voltage across the second parasitic capacitor (denoted by the reference numeral Cp2 in FIG. 2) is smaller than the threshold value of the power semiconductor switch (denoted by the reference numeral 330 of FIG. 2), thereby maintaining the power semiconductor switch in an off state. In other embodiments, for driving the power semiconductor switch (denoted by the reference numeral 330 in FIG. 2) to be turned off, the drive pulse modulation circuit outputs a plurality of negative narrow pulse signals, and outputs one negative narrow pulse signal at second predetermined intervals, such that the voltage across the second parasitic capacitor (denoted by the reference numeral Cp2 in FIG. 2) is smaller than the threshold value of the power semiconductor switch (denoted by the reference numeral 330 in FIG. 2), thereby maintaining the power semiconductor switch in an off state. In this way, the simple drive circuit of the power semiconductor switch can be realized. On the one hand, it can realize the function of gate anti-interference; on the other hand, the gate voltage of the power semiconductor switch will not be pulled up, and it can ensure that the power semiconductor switch will not be damaged.

In the embodiment shown in FIG. 5, the drive pulse demodulation circuit 600 includes a first controlled switch 621, a second controlled switch 622, a control terminal circuit 640, and a second zener diode 641. A first end of the first controlled switch 621 is connected to a first end of the secondary winding 632 and a first end of the control terminal circuit 640. A first end of the second controlled switch 622 is connected to a second end of the secondary winding 632 and a second end of the control terminal circuit 640. A third end of the control terminal circuit 640 is connected to a control end of the first controlled switch 621. A fourth end of the control terminal circuit 640 is coupled to a control end of the second controlled switch 622. A second end of the first controlled switch 621 is coupled to a first end of the second zener diode 641 and a second end of the second controlled switch 622 is coupled to a second end of the second zener diode 641. Further, the first end of the second zener diode 641 is connected to a first input end of the gate circuit 610, and the second end of the second zener diode 641 is connected to a second input end of the gate circuit 610. In the embodiment shown in FIG. 5, the gate circuit 610 of the power semiconductor switch further includes a first resistor R1. A first end of the first resistor R1 is connected to the first end of the zener diode (denoted by the reference numeral 340 in FIG. 2) and the gate of the power semiconductor switch (denoted by reference numeral 330 in FIG. 2), and a second end of the first resistor R1 is connected to the second end of the zener diode (denoted by the reference numeral 340 in FIG. 2) and the second end of the power semiconductor switch (denoted by reference numeral 330 in FIG. 2)

Figure 6:
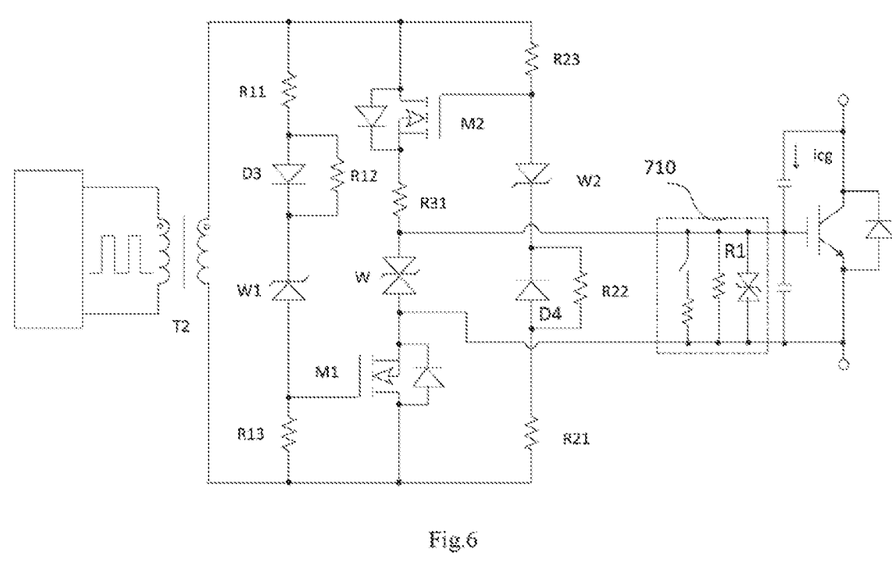
FIG. 6 is a schematic diagram of a gate drive circuit for a power semiconductor switch according to a fifth embodiment of the present disclosure.

FIG. 6 is a schematic diagram of a gate drive circuit for a power semiconductor switch according to a fifth embodiment of the present disclosure. FIG. 6 shows a specific implementation of the drive pulse demodulation circuit 600. The control circuit of the drive pulse demodulation circuit includes resistors R11, R12, R13, R31, R23 and R21, diodes D3 and D4, zener diodes W1 and W2. A first end of the resistor R11 is connected to a first end of the first controlled switch M2, a first end of the resistor R23 and a first end of the secondary winding of the pulse transformer T2. A second end of the resistor R11 is connected to an anode of the diode D3 and a first end of the resistor R12. A cathode of the diode D3 is connected to a second end of the resistor R12 and a cathode of the zener diode W1. An anode of the zener diode W1 is connected to the resistor R13 and a control end of the second controlled switch M1. A second end of the resistor R23 is connected to a control end of the first controlled switch M2 and an anode of the zener diode W2. A cathode of the zener diode W2 is connected to a cathode of the diode D4 and a first end of the resistor R22. An anode of the diode D4 is connected to a second end of the resistor R22 and a first end of the resistor R21. A second end of the resistor R21 is connected to a second end of the resistor R13, a second end of the second controlled switch M1 and a second end of the secondary winding of the pulse transformer T2. A second zener diode W is coupled between a first end of the second controlled switch M1 and a second end of the first controlled switch M2.

When a positive pulse is transmitted through the primary winding of the transformer T2 to the secondary winding, the resistor R11, the diode D3, the zener diode W1, and the resistor R13 cause the gate voltage of the second controlled switch M1 to jump to a high level, thereby making the second controlled switch M1 to be turned on. At this time the positive pulse charges the gate of the IGBT through the diode reversely collected in parallel to the first controlled switch M2 and the resistor R31. On the contrast, when a negative pulse is transmitted through the primary winding of the transformer T2 to the secondary winding, the resistor R21, the diode D4, the zener diode W2, and the resistor R23 may cause the gate voltage of the first controlled switch M2 to jump to a high level, such that the first controlled switch M2 is turned on. At this time, the negative pulse discharges the gate of the IGBT through the diode reversely collected in parallel to the second controlled switch M1 and the resistor R31.

The gate circuit and the gate drive circuit of the power semiconductor switch provided by the present disclosure have the following advantages compared to the related art. On the one hand, the gate drive circuit of the power semiconductor switch provided by the present disclosure only includes the resistor, the zener diode and the self-control switch, thus having a simple structure. On the other hand, it can also retain the advantages of a small number of devices and a low cost as the simple drive circuit has. Moreover, it can improve the gate anti-interference ability of the simple drive circuit, thus improving the circuit reliability.

The present disclosure has been described by the above related embodiments, but the above embodiments are merely examples for implementing the present disclosure. It must be noted that the disclosed embodiments do not limit the scope of the present disclosure. Conversely, modifications and refinements made without departing from the spirit and scope of the present disclosure are the scope of the present disclosure.

What is claimed is:

1. A gate circuit for a power semiconductor switch, comprising: a zener diode and a charge dissipation circuit, wherein a first end of the zener diode is connected to a first end of the charge dissipation circuit and a gate of the power semiconductor switch, a second end of the zener diode is connected to a second end of the charge dissipation circuit and a second end of the power semiconductor switch;

a first parasitic capacitor is formed between a first end and the gate of the power semiconductor switch, and a second parasitic capacitor is formed between the gate and the second end of the power semiconductor switch; when a voltage jump occurs between the first end and the second end of the power semiconductor switch, a current output from the first end is injected into the first parasitic capacitor and the second parasitic capacitor; when the current is greater than or equal to a preset value, the charge dissipation circuit works, such that charges on the first parasitic capacitor and the second parasitic capacitor are discharged through the charge dissipation circuit.

2. The gate circuit for a power semiconductor switch according to claim 1, wherein the charge dissipation circuit comprises a first switch and a second resistor,
the first switch and the second resistor are connected in series to form a series branch, a first end of the series branch is connected to the first end of the charge dissipation circuit, and a second end of the series branch is connected to the second end of the charge dissipation circuit.

3. The gate circuit for a power semiconductor switch according to claim 2, wherein when the current is greater than or equal to the preset value, the first switch is turned on, such that the charge dissipation circuit works.

4. The gate circuit for a power semiconductor switch according to claim 2, wherein when the current is less than the preset value, the first switch is turned off, such that the charge dissipation circuit stops working.

5. The gate circuit for a power semiconductor switch according to claim 1, wherein the charge dissipation circuit comprises a first diode, a second resistor, a transistor, a third resistor, a fourth resistor, a second diode and a capacitor,
an anode of the first diode is connected to a first end of the third resistor, a first end of the capacitor, a first end of the fourth resistor and a base of the transistor,
a cathode of the first diode, a second end of the third resistor and an emitter of the transistor are connected to the first end of the charge dissipation circuit,
a collector of the transistor is connected to an anode of the second diode,
a cathode of the second diode is connected to a first end of the second resistor, and
a second end of the capacitor, a second end of the fourth resistor and a second end of the second resistor are connected to the second end of the charge dissipation circuit.

6. The gate circuit for a power semiconductor switch according to claim 5, wherein the transistor is a PNP type transistor.

7. The gate circuit for a power semiconductor switch according to claim 5, wherein when the current is greater than or equal to the preset value, the transistor is turned on, such that the charge dissipation circuit works.

8. The gate circuit for a power semiconductor switch according to claim 5, wherein when the current is less than the preset value, the transistor is turned off, such that the charge dissipation circuit stops working.

9. The gate circuit for a power semiconductor switch according to claim 1, wherein the charge dissipation circuit comprises a second switch and a fifth resistor,
a first end of the second switch and a second end of the fifth resistor are connected to the first end of the charge dissipation circuit;
a second end of the second switch is connected to the second end of the charge dissipation circuit; and
a control end of the switch is connected to a first end of the fifth resistor.

10. The gate circuit for a power semiconductor switch according to claim 9, wherein the second switch is a thyristor.

11. The gate circuit for a power semiconductor switch according to claim 9, wherein when the current is greater than or equal to the preset value, the second switch is turned on, such that the charge dissipation circuit works.

12. The gate circuit for a power semiconductor switch according to claim 9, wherein when the current is less than the preset value, the second switch is turned off, such that the charge dissipation circuit stops working.

13. The gate circuit for a power semiconductor switch according to claim 2, further comprising a first resistor, wherein a first end of the first resistor is connected to the first of zener diode and the gate of the power semiconductor switch, and a second end of the first resistor is connected to the second end of zener diode and the second end of the power semiconductor switch.

14. A gate drive circuit for a power semiconductor switch, comprising: a drive pulse modulation circuit, a pulse transformer, a drive pulse demodulation circuit, and a gate circuit for a power semiconductor switch according to claim 1,
wherein an output end of the drive pulse modulation circuit is connected to a primary winding of the pulse transformer, a secondary winding of the pulse transformer is connected to an input end of the drive pulse demodulation circuit, and an output end of the e drive pulse demodulation circuit is connected to the gate circuit; the drive pulse modulation circuit is configured to receive a control signal and modulate the control signal into at least one positive and negative narrow pulse signal to be transmitted to the drive pulse demodulation circuit through the pulse transformer, for charging or discharging the second parasitic capacitor through the drive pulse demodulation circuit to drive the power semiconductor switch to be turned on or off.

15. The gate drive circuit according to claim 14, wherein the drive pulse demodulation circuit comprises a first controlled switch, a second controlled switch, a control terminal circuit, and a second zener diode,
a first end of the first controlled switch is connected to a first end of the secondary winding and a first end of the control terminal circuit,
a first end of the second controlled switch is connected to a second end of the secondary winding and a second end of the control terminal circuit,
a third end of the control terminal circuit is connected to a control end of the first controlled switch,
a fourth end of the control terminal circuit is connected to a second controlled switch,
a second end of the first controlled switch is coupled to a first end of the second zener diode, and
a second end of the second controlled switch is coupled to a second end of the second zener diode.

16. The gate drive circuit according to claim 15, wherein the first end of the second zener diode is connected to a first input end of the charge dissipation circuit, and the second end of the second zener diode is connected to a second input of the charge dissipation circuit.

17. The gate drive circuit according to claim 14, wherein the gate circuit further comprises a first resistor,
a first end of the first resistor is connected to the first end of the zener diode and the gate of the power semiconductor switch,
a second end of the first resistor is connected to the second end of the zener diode and the second end of the power semiconductor switch.

18. The gate drive circuit according to claim 14, wherein the positive and negative narrow pulse signals comprise a driving pulse signal and an energy pulse signal.

19. The gate drive circuit according to claim 14, wherein for driving the power semiconductor switch to be turned on, the drive pulse modulation circuit is configured to output one positive narrow pulse signal at first predetermined intervals, such that a voltage across the second parasitic capacitor is greater than or equal to a threshold of the power semiconductor switch, in order to drive the power semiconductor switch to be turned on.

20. The gate drive circuit according to claim 14, wherein for driving the power semiconductor switch to be turned off, the drive pulse modulation circuit is configured to output at least one negative narrow pulse signal such that the voltage across the second parasitic capacitor is less than a threshold of the power semiconductor switch, in order to drive the power semiconductor switch to be turned off.

\* \* \* \* \*